United States Patent [19]

Hanazato et al.

[11] Patent Number: 5,349,203
[45] Date of Patent: Sep. 20, 1994

[54] ORGANIC ELECTRIC-FIELD SWITCHING DEVICE

[75] Inventors: Yoshio Hanazato; Satoru Isoda; Satoshi Ueyama; Satoshi Nishikawa, all of Amagasaki, Japan

[73] Assignee: Mitsubishi Denki Kabushiki Kaisha, Tokyo, Japan

[21] Appl. No.: 963,139

[22] Filed: Oct. 19, 1992

[30] Foreign Application Priority Data

Dec. 9, 1991 [JP] Japan .................. 3-324739
Jun. 12, 1992 [JP] Japan .................. 4-153798

[51] Int. Cl.$^5$ ........................... H01L 29/28
[52] U.S. Cl. .......................... 257/40; 257/192; 257/289; 257/347
[58] Field of Search ............... 257/40, 192, 289, 347

[56] References Cited

U.S. PATENT DOCUMENTS

| | | | |
|---|---|---|---|
| 4,360,703 | 11/1982 | Bolton et al. | 257/40 |
| 5,153,681 | 10/1992 | Kishimoto et al. | 257/40 |
| 5,185,208 | 2/1993 | Yamashita et al. | 257/40 |
| 5,211,762 | 5/1993 | Isoda et al. | 257/40 |

FOREIGN PATENT DOCUMENTS

| | | |
|---|---|---|
| 0291659 | 11/1988 | European Pat. Off. . |
| 0390132 | 3/1990 | European Pat. Off. . |
| 0390523 | 10/1990 | European Pat. Off. . |
| 0418504 | 3/1991 | European Pat. Off. . |
| 2224669 | 5/1990 | United Kingdom . |

*Primary Examiner*—Sara W. Crane
*Attorney, Agent, or Firm*—Wolf, Greenfield & Sacks

[57] ABSTRACT

An organic electric-field switching device has transparent or semitransparent upper electrodes and second insulating film so as to bias an electric field on a heterojunction membrane formed on a lower electrode, in which the doping speed of a carrier is fast, and the switching device can be operated as the solid-state device and can be easily formed on a semiconductor made of silicon and the like. Therefore, the degree of integration of the device can be rapidly increased due to its multilayered structure.

12 Claims, 6 Drawing Sheets

ORGANIC ELECTRIC-FIELD SWITCHING DEVICE

BACKGROUND OF THE INVENTION

1. Field of Invention

The present invention relates to a device in which a switching operation is made possible by means of an electric-field and a light or by means of an electric-field and, more particularly, to an organic electric-field switching device which can be easily transformed into a solid state device and has a neuro-information processing function of a multi-inputs/single output.

2. Description of the Related Art

Conventionally, a field-effect transistor made of a conductive polymer material has been employed as a device for switching by changing the conductivity between a source electrode and a drain electrode to an organic membrane by means of doping of a gas or an ion. In the above conventional way, the doping is achieved by an electrochemical method in which an electrolyte solution or a solid-state electrolyte is used, or by a method in which gas is diffused in an oxidizing gas ambient atmosphere. In the conductive polymer material, when the amount of a dopant adds in a few percent from zero, the conductivity characteristic changes dramatically, therefore, the manufacturing of the electric-field switching device can be realized by controlling the amount or the dopant by means of the electric-field.

FIG. 9 is a schematic diagram of the conventional organic electric-field switching device which utilizes a method of carriers' electric-field injection into the conductive polymer material, the method of which was disclosed by Elizabeth W. Faul, Antonio J. Rico, and Mark S. Wrighton, et al. "J. Physical Chemistry." 1985, vol. 89, p.1441.

In FIG. 9, a source electrode 2 and a drain electrode 3 are formed on a substrate and these electrodes and the substrate are disposed in a container 10. These electrodes are covered with a poly-aniline membrane 1 made of a conductive material. The container 10 is filled with sodium hydrogensulfate electrolyte solution 4. A reference electrode 5 containing electrolyte solution therein, the source electrode 2 and the drain electrode 3 are immersed in the sodium hydrogensulfate solution 4.

A description of an operation of the device will be given below. When a positive gate-voltage (0 to 0.3 V) is biased on the poly-aniline membrane, through the reference electrode 5 and sodium-hydrogensulfate electrolyte solution 4, conductivity is changed due to electrochemical oxidation of the poly-aniline membrane 1. When the voltage between the source electrode 2 and the drain electrode 3 is gradually swept during the oxidation (0 to 200 mV, 10 mV/sec), a characteristic of a field-effect transistor and the like can be obtained between a drain current, which flows between these electrodes 2 and 3, and the gate voltage.

As the conventional organic electric-field switching device has the foregoing construction, it is difficult to transform this device into a solid-state device because the electrolyte solution 4 or the reference electrode 5, which contains electrolyte solution therein, must be employed when the doping of the carrier is carried out by an electrochemical oxidation-and-reduction of the conductive polymer material for enabling switching by utilizing to the utmost the variation in conductivity. In addition, there has been a problem in that it is difficult to enable doping to be performed selectively in a plurality of predetermined areas of the conductive polymer materials by using a plurality of the reference electrodes 5 with the result that the multi-inputs cannot be converted into a single output because the reference electrode 5 biases the same level of the voltage on all of the electrolyte solution 4.

SUMMARY OF THE INVENTION

In order to overcome the above described problems, the present invention is aimed at providing an organic electric-field switching device which can perform a neuro-information function such as a multi-inputs/single-output function, wherein the device can be a solid-state device because the doping of the carrier towards the organic membrane is enabled without using electrolyte solution, while at the same time local doping is made possible because the plurality of the input electrodes are formed.

To this end, these is provided an organic electric-field switching device which comprises a lower electrode; a first insulation film formed locally on the lower electrode; a hetero-junction membrane formed on the first insulating film and said lower electrode; a second insulating and transparent or semitransparent film formed on the hereto-junction membrane; a source electrode formed on the hetero-junction membrane, penetrating the second insulating film; a drain electrode formed on the hetero-junction membrane, penetrating the second insulating film; and a transparent or semitransparent upper electrode formed on the second insulating film.

In the organic electric-field switching device of the present invention, the lower electrode and the transparent or semitransparent upper electrodes are disposed vertically via the insulating film to the junction surface of the hetero-junction membrane comprising a plurality of molecular-films having a different redox potential, wherein the doping of the carrier (an electron or a hole) from the lower-electrode or source-electrode to the inside of the hetero-junction membrane is enabled by biasing the voltages between these electrodes and by simultaneously irradiating light on the hetero-junction membrane through the transpatent or semitransparent upper electrodes and the insulating film. Accordingly, in this organic electric-field switching device, the speed of carriers is fast, and a dopant is not an ion which requires the electrolyte solution but an electron or a hole which is the ordinal carrier of a solid-state device. Therefore, the organic electric-field switching device has a faster switching speed than that of a switching device using an ion, and it also can be operated as a solid-state device. Furthermore, the organic electric-field switching device can be easily formed on a semiconductor made of silicon and the like. Therefore, the degree of integration of the device can be rapidly increased due to its multilayered structure.

Furthermore, the multi-inputs/single-output function, which is indispensable for the neuro-information processing (neural network) which converts a plurality of the input signals into single output signal, can be obtained by disposing the plurality of the transparent or semitransparent upper electrodes to control the conductivity between the source electrode and the drain electrode by means of the plurality of the input signals biased each upper electrode.

Also, there is provided an organic electric-field switching device which comprises a lower electrode; a first insulation film formed locally on the lower electrode; a hetero-junction membrane formed on the first insulating film and the lower electrode; a second insulating film formed on the hetero-junction membrane; a source electrode formed on the hetero-junction membrane, penetrating the second insulating film; a drain electrode formed on the hereto-junction membrane, penetrating the second insulating film; and an upper electrode formed on the second insulating film.

DESCRIPTION OF THE PREFERRED EMBODIMENTS

A description of examples of the present invention will be given below in conjunction with the accompanying drawings.

EXAMPLE 1

Figure 1:
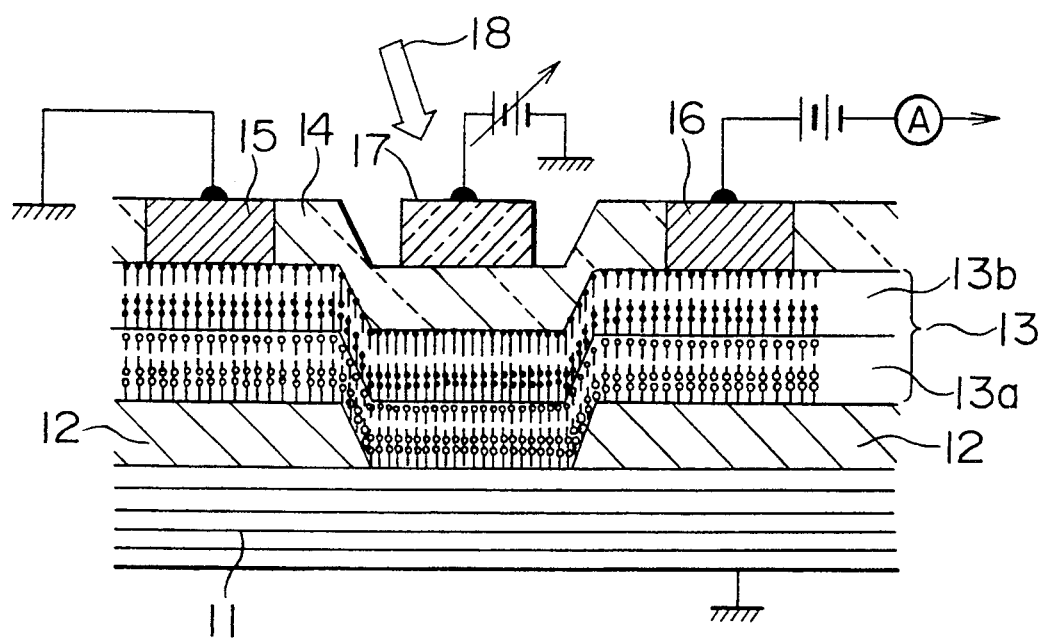
FIG. 1 is a sectional view of an example 1 of an organic electric-field switching device according to the present invention.
Figure 2:
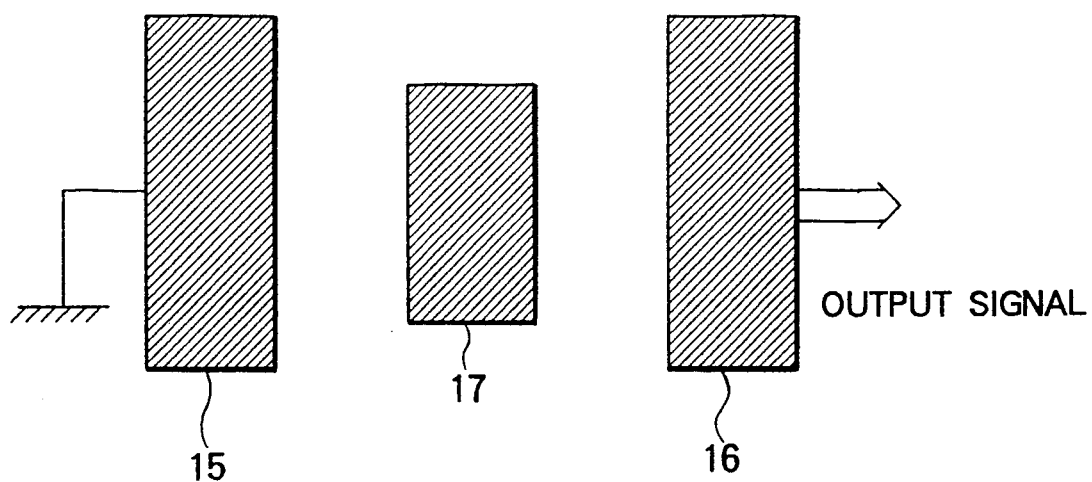
FIG. 2 is a schematic plan view of the organic electric-field switching device shown in FIG. 1.

FIGS. 1 and 2 are a sectional view and a schematic plan view, respectively, of an example 1 of the organic electric-field switching device according to the present invention. In these accompanying drawings, top of a lower electrode 11 made of a conductive material such as metal, a first insulating film 12 is provided. On top of the lower electrode 11 and the insulating film 12, a hetero-junction membrane 13 having a molecular-film junction with a different redox potential is formed. The hetero-junction membrane 13 comprises a molecular film 13a, having a certain redox potential, and another molecular film 13b having redox potential different from that of the molecular film 13a.

On the hetero-junction membrane 13, a second insulating film 14 having a transparent or semitransparent characteristic is formed. An insulating film made of a long-chain fatty acid such as arachidic acid or stearic acid is used as the insulting film 14 for the present invention. A source electrode 15, which is made of a conductive material such as metal, is provided on the hetero-junction membrane 13 to locally penetrate through the insulating film 14. A drain electrode 16, made of a conductive material such as metal, is provided on the hetero-junction membrane 13 to locally penetrate through the insulating film 14. A transparent or semitransparent upper electrode 17 is formed on the insulating film 14. A translucent aluminum-electrode having a thickness of 10 nm or a transparent ITO (indium-tin oxide)—electrode, for example, is used as the transparent or semitransparent upper electrode 17. Light 18 emitted from an exterior light-source (not shown) is irradiated on the hetero-junction membrane 13 through the transparent or semitransparent upper electrode 17 and the insulating film 14.

The following is a description of a method of manufacturing the organic electric-field switching device.

First, an aluminum deposition film, for example, one having approximately 50 to 100 nm thickness, is formed as the lower electrode 11 by a vacuum deposition method on a substrate (not shown). On the aluminum deposition film, a $SiO_2$ film, for example, one having a thickness of 50 to 100 nm, is formed as the insulating film 12 is formed by the vacuum deposition or sputtering methods. Then, utilizing to the utmost the fine-processing technology of a semiconductor, a local patterning on the insulating film 12 is achieved. On the $SiO_2$ film formed as the insulating film 12, nine layers of hematoporphyrin (IX)-bis (tridecanoylether) Ru(P-(OCH$_3$)$_3$)$_2$ Br (hereinafter abbreviated as RuHP(ph)$_2$) are laminated by a Langmuir-Blodgett method (hereinafter abbreviated as LB method) to form the molecular film 13a having redox potential.

On the molecular film 13a, due to the molecular film 13b having the redox potential different from that of the molecular film 13a, ten layers of 7- and 8-dimethyl-3, 10-dinonyl isoalloxiazine (hereinafter abbreviated as DNI) are laminated by the LB method to form the hetero-junction membrane 13.

More than ten layers of the transparent or semitransparent insulating film 14, which are made of long-chain fatty acid such as arachidic acid or stearic acid, are formed by the LB method on the hetero-junction membrane 13. Then, etching is executed locally on the insulating film 14, and the source electrode 15 and the drain electrode 16, which, for instance, penetrate through the insulating film 14 on the aluminum deposition film to contact the molecular film 13b, are formed. At the same time the upper electrode 17 is formed on the insulating film 14.

A description of the operation of the organic electric-field switching device is given below.

When voltage is biased between the source electrode 15 and the drain electrode 16 while it is not biased between the upper electrode 17 and the lower electrode 11, a leak current of approximately the same level as that of the insulating film 12 and 14 and having less carriers is observed in the hetero-junction mambrane 13. In the next step, while a light beam of, for instance, 360 nm or 450 nm, which are the excitation wavelengths of the DNI, and having a luminous intensity of approximately 1 mW/cm$^2$ is irradiated on the hetero-junction membrane 13 through the upper electrode 17 and the insulating film 14, and while, at the same time, the voltage is applied between the upper electrode 17 and the lower electrode 11, the voltage is biased between the source electrode 15 and the drain electrode 16.

Then, utilizing to the utmost the internal electric-field of the hetero-junction membrane of the DNI and RuHp (ph)$_2$, charge-separation and charge-transfer which takes an initial procedure of a light excitation of the DNI occur and generate an increased number of carriers on the hetero-junction membrane 13. At the same time, a doping of the carries is done from the lower electrode 11 or source electrode 15 by the applied voltage such that these carriers are accumulated around the junction surface of the hetero-junction membrane 13. As a result, the number of the carriers increases, which thus produces better conductivity and the increased current between the source electrode 15 and the drain electrode 16. The number of the carriers depends on field intensity or the voltage biased between the upper electrode 17 and the lower electrode 11, and also depends on luminous intensity irradiated through the upper electrode 17 and the insulating film 14. Therefore, a current value between the source electrode 15 and the drain electrode 16 is controlled by the above two parameters.

EXAMPLE 2

Figure 3:
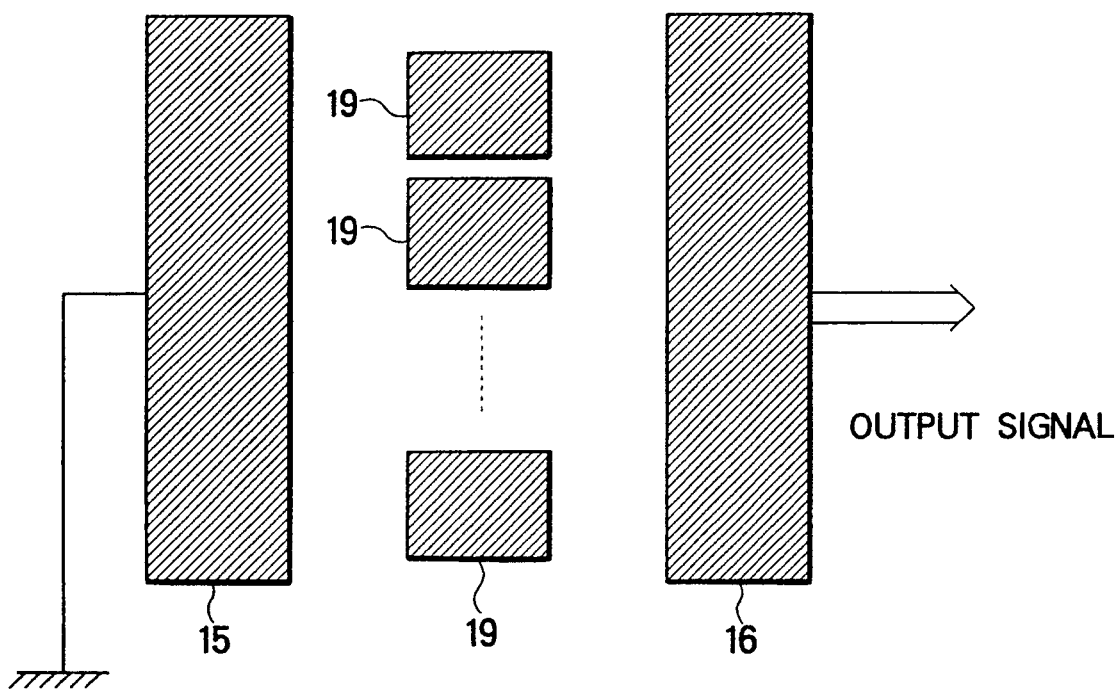
FIG. 3 is a schematic plan view of an example 2 of the organic electric-field switching device according to the present invention.

FIG. 3 is a schematic plan view of an example 2 of the organic electric-field switching device according to the present invention. In the example 2, a plurality of transparent or semitransparent upper electrodes are juxtaposed in a row substantially padrallel to the source electrode and the drain electrode. Namely, in FIG. 3, the plurality of the transparent or semitransparent upper electrodes 19 are disposed in parallel with the source electrode 15 and the drain electrode 16 therebetween.

When the plurality of input signals are biased on each upper electrode 19 as voltages, and simultaneously, when the light which can excite the DNI is irradiated on all the upper electrodes 19, current which corresponds to the sum of the plurality of these input voltages flows between the source electrode 15 and the drain electrode 16. Consequently, a multi-inputs/single-output conversion function, which is one of the essential integral portion of the neural network for converting the plurality of the input signals (voltages) into one output signal (current), can be obtained.

When the distance between the source electrode 15 and the drain electrode 16, and also between the respective upper electrodes 19, are reduced to an extent of the sub-micron area, the doping of carriers on the hetero-junction membrane 13 under each upper electrode 19 takes place when light, which can excite the DNI by penetrating each upper electrode 19 and the insulating film 14, is irradiated on the hetero-junction membrane 13, and when voltages are biased on each upper electrode 19 and the lower electrode 11 at the same time. However, as time passes away, the area, where the carriers are doped, extends by diffusion from the portion of the hetero-junction membrane 13 under each upper electrode 19, thus the characteristic of multi-inputs/single-output conversion function is changed into a non-linear characteristic.

Consequently, a function of plasticity which is an essential function of the neural network also can be obtained, wherein threshold values of current flowing between the source electrode 15 and the drain electrode 16 vary in accordance with the number of the input signals being biased on each upper electrode 19.

In addition, the input signal can be arbitrarily predetermined by selecting the upper electrodes which can transmit the irradiated light.

EXAMPLE 3

Figure 4:
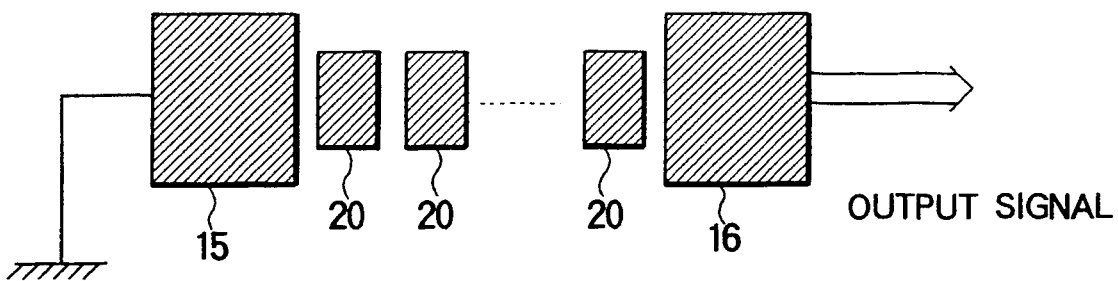
FIG. 4 is a schematic plan view of an example 3 of the organic electric-field switching device according to the present invention.

FIG. 4 is a schematic plan view of an example 3 of the organic electric-field switching device according to the present invention. As shown in FIG. 4, in the example 4 a plurality of the tranaparent or semitransparent upper electrodes 20 are juxtaposed in a row substantially in series to the source electrode 15 and the drain electrode 16 therebetween.

When the plurality of input signals are biased as the voltage on each upper electrode 20, and at the same time when light is irradiated on all the upper electrodes 20, current will flow between the source electrode 15 and the drain electrode when all of the plurality of the input voltages exist, and will not flow between the above electrodes when at least one input voltage is missing out of the plurality of the upper electrodes. Consequently, a multi-inputs/single-output conversion function, which is one of the essential integral portion of the neural network for converting the plurality of the input signals (voltages) into one output signal (current), can be obtained.

When the distance between the source electrode 15 and the drain electrode 16, and also between the respective upper electrodes 20, are reduced to an extent of sub-micron area, the doping of carriers on the hetero-junction membrane 13 under each upper electrode 20 takes place when light, which can excite the DNI by penetrating each upper electrode 20 and the insulating film 14, is irradiated on the hetero-junction membrane 13, and when voltages are biased on each upper electrode 20 and the lower electrode 11 at the same time. However, as time passes away, the area, where the carriers are doped, extends by diffusion from the portion of the hetero-junction membrane 13 under each upper electrode 20, thus the characteristic of the multi-inputs/single-output conversion function is changed into a non-linear characteristic.

When the distance between the source electrode 15 and the drain electrode 16, and also the distance between the respective upper electrodes 20, are rather longer to a certain extent, current flows between the source electrode 15 and the drain electrode 16 only when all the input voltages exist. However, when the distance between the source electrode 15 and the drain electrode 16, and also between the respective upper electrodes 20, are reduced to an extent of the sub-micron area, and, for example, when there are input voltages in at least seven upper electrodes 20 out of ten of these, current flows between the source electrode 15 and the drain electrode 16. Consequently, a function of plasticity which is an essential function of the neural network can be also obtained, wherein threshold values of current flowing between the source electrode 15 and the drain electrode 16 vary in accordance with the number of the input signals being biased on each upper electrode 20.

In addition, the input signals can be arbitrarily determined by selecting the upper electrodes which penetrate irradiated light.

EXAMPLE 4

Figure 5:
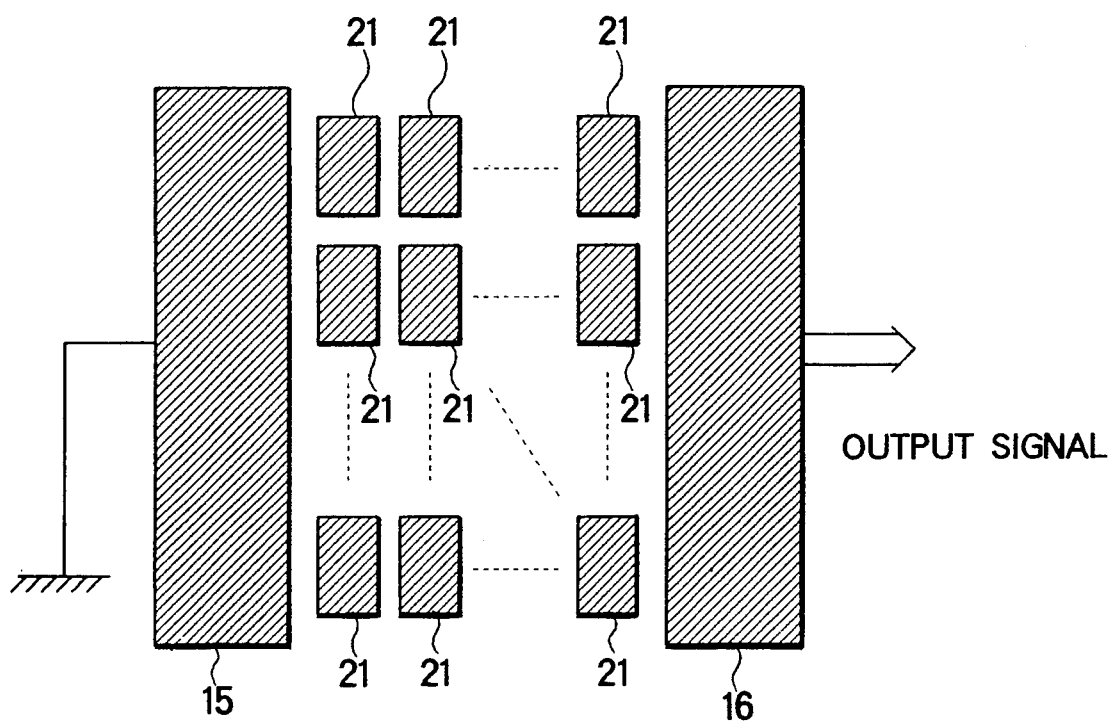
FIG. 5 is a schematic plan view of an example 4 of the organic electric-field switching device according to the present invention.

FIG. 5 is a schematic plan view of an example 4 of the organic electric-field switching device. As shown in FIG. 5, in this example 4, a plurality of transparent of semitransparent upper electrodes 21 are disposed in a matrix form against the source electrode 15 and the drain electrode 16.

When the plurality of input signals are biased as voltages on each upper electrode 21 having a matrix form, and at the same time when light which can excite the DNI is irradiated on all of the upper electrodes 21, current flows between the source electrode 15 and the drain electrode 16 in accordance with the number of rows in series of the upper electrodes 21 on which the input voltage has been biased only when all of the plurality of these input voltage exist against each upper electrode 21 in the series direction (row-direction) between the source electrode 15 and the drain electrode 16. Consequently, multi-inputs/single-output conversion function, which is one of the essential integral portion of the neural network for converting the plurality of the input signals (voltages) into one output signal (current), can be obtained.

When the distance between the source electrode 15 and the drain electrode 16, and also between the respective upper electrodes 21, are reduced to an extent of the sub-micron area, the doping of carriers on the hetero-junction membrane 13 under each upper electrode 21 takes place when light, which can excite the DNI by penetrating each upper electrode 21 and the insulating film 14, is irradiated the hetero-junction membrane 13, and when voltages are biased on the each upper electrode 21 and the lower electrode 11 at the same time. However, as time passes away, the area where the carriers are doped extends by diffusion from the portion of the hetero-junction membrane 13 under each upper electrode 21, thus the characteristic of the multi-inputs/single-output conversion function is changed into a non-linear characteristic.

When the distance between the source electrode 15 and the drain electrode 16, and also between the respective upper electrodes 20, are rather longer to a certain extent, a current value between the source electrode 15 and the drain electrode 16 is determined by the relation of a series direction in the matrix form. However, when the distance between the source electrode 15 and the drain electrode 16, and also between the respective upper electrodes 21, are reduced to an extent of the sub-micron area, current flows in accordance with the ratio of the number of the upper electrodes 21 which actually received the input voltage to the number of the upper electrodes 21 of the matrix form. Consequently, a function of plasticity which is an essential function of the neural network can be also obtained, wherein threshold values of current flowing between the source electrode 15 and the drain electrode 16 vary in accordance with the number of the input signals being biased on each upper electrode 21.

In addition, the input signals can be arbitrarily determined by selecting the upper electrodes which penetrate irradiated light.

In the organic electric-field switching device of the present invention, the speed of carriers are fast, and a dopant is not an ion which requires the electrolyte solution but an electron or a hole which is the ordinal carrier of a solid-state device. Therefore, the organic electric-field switching device has faster switching speed than that of a switching device using an ion, and also can be operated as a solid-state device. Furthermore, the organic electric-field switching device can be easily formed on a semiconductor made of silicon and the like. Therefore, the degree of integration of the device can be rapidly increased by its multilayered structure, and also, the multi-inputs/single-output function, which is indispensable for the neuro-information processing (neural network) which converts a plurality of the input signals into single output signal, can be obtained. At the same time, a function of plasticity which is an essential function of the neural network can be also obtained.

EXAMPLE 5

Figure 6:
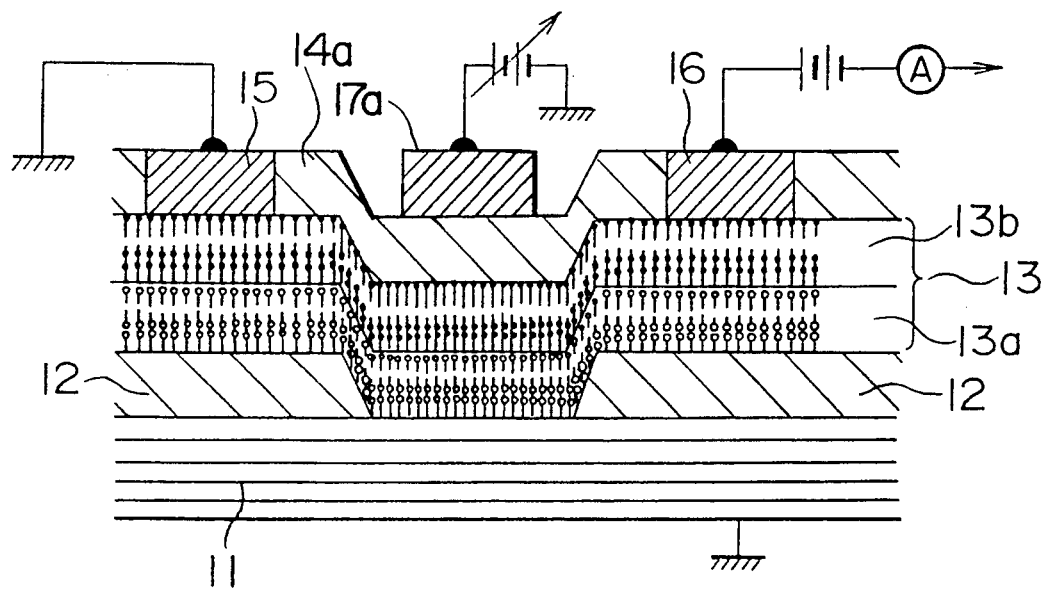
FIG. 6 is a sectional view of an example 5 of an organic electric-field switching device according to the present invention.
Figure 7:
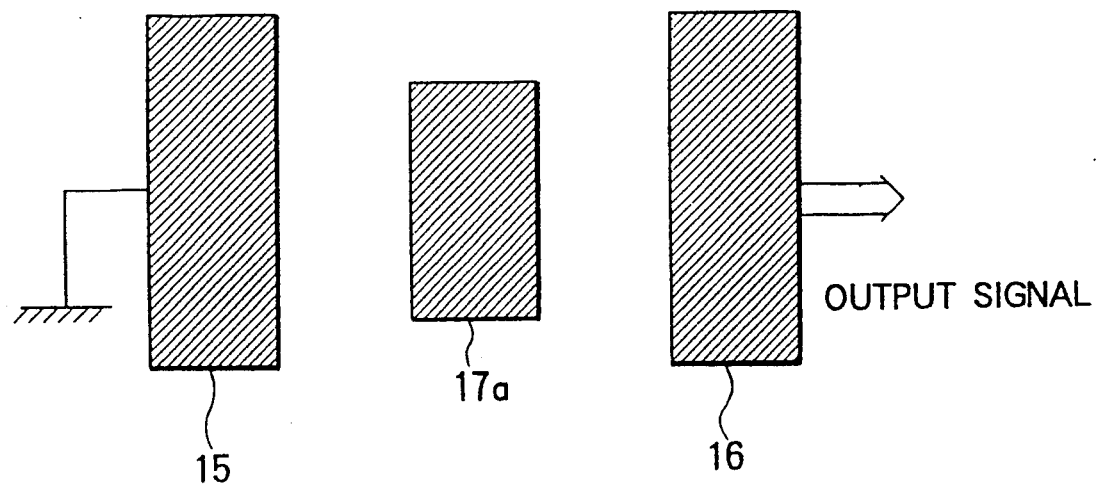
FIG. 7 is a schematic plan view of the organic electric-field switching device shown in FIG. 6.

FIGS. 6 and 7 are a sectional view and a schematic plan view, respectively, of an example of the organic electric-field switching device according to the present invention. In these accompanying drawings, top of a lower electrode 11 made of a conductive material such as metal, a first insulating film 12 is provided. On top of the lower electrode 11 and the insulating film 12, a hetero-junction membrane 13 having a molecular-film junction with a different redox potential is formed. The hetero-junction membrane 13 comprises a molecular film 13a, having a certain redox potential, and another molecular film 13b having redox potential different from that of the molecular film 13a.

On the hetero-junction membrane 13, a second insulating film 14a is formed. A source electrode 15, which is made of a conductive material such as metal, is provided on the hetero-junction membrane 13 to locally penetrate through the insulating film 14a. A drain electrode 16, made of a conductive material such as metal, is provided on the hereto-junction membrane 13 to locally penetrate through the insulating film 14a. An upper electrode 17a, made of a conductive material such as metal, is formed on the insulating film 14a.

The following is a description of a method of manufacturing the organic electric-field switching device.

First, an aluminum deposition film, for example, one having approximately 50 to 100 nm thickness, is formed as the lower electrode 11 by a vacuum deposition method on a substrate (not shown). On the aluminum deposition film, a SiO$_2$ film, for example, one having a thickness of 50 to 100 nm, is formed as the insulating film 12 is formed by the vacuum deposition or sputtering methods. Then, utilizing to the utmost the fine-processing technology of a semiconductor, a local patterning on the insulating film 12 is achieved. On the SiO$_2$ film formed as the insulating film 12, nine layers of hematoporphyrin (IX)-bis (tridecanoylether) Ru(P-(OCH$_3$)$_3$)$_2$ Br (hereinafter abbreviated as RuHP(ph)$_2$) are laminated by a Langmuir-Blodgett method (hereinafter abbreviated as LB method) to form the molecular film 13a having redox potential.

On the molecular film 13a, due to the molecular film 13b having the redox potential different from that of the molecular film 13a, ten layers of 7-and 8-dimethyl-3, 10-dinonyl isoalloxiazine (hereinafter abbreviated as DNI) are laminated by the LB method to form the hetero-junction membrane 13.

More than ten layers of the insulating film 14a, which are made of long-chain fatty acid such as arachidic acid or stearic acid, are formed by the LB method on the hetero-junction membrane 13. Then, etching is executed locally on the insulating film 14a, and the source electrode 15 and the drain electrode 16, which, for instance, penetrate through the insulating film 14a on the aluminum deposition film to contact the molecular film 13b, are formed. At the same time the upper electrode 17a is formed on the insulating film 14a.

A description of the operation of the organic electric-field switching device is given below.

When voltage is biased between the source electrode 15 and the drain electrode 16 while it is not biased between the upper electrode 17a and the lower electrode 11, a leak current of approximately the same level as that of the insulating film 12 and 14a and having less carriers is observed in the hereto-junction mambrane 13. In the next step, the voltage is applied between the upper electrode 17a and the lower electrode 11, the voltage is biased between the source electrode 15 and the drain electrode 16.

Then, a doping of the carries is done from the lower electrode 11 or source electrode 15 by the applied voltage such that these carriers are accumulated around the junction surface of the hetero-junction membrane 13. As a result, the number of the carriers increases, which thus produces better conductivity and the increased current between the source electrode 15 and the drain electrode 16. The number of the carriers depends on field intensity or the voltage biased between the upper electrode 17a and the lower electrode 11. Therefore, a current value between the source electrode 15 and the drain electrode 16 can be controlled by the biased voltage.

EXAMPLE 6

Figure 8:
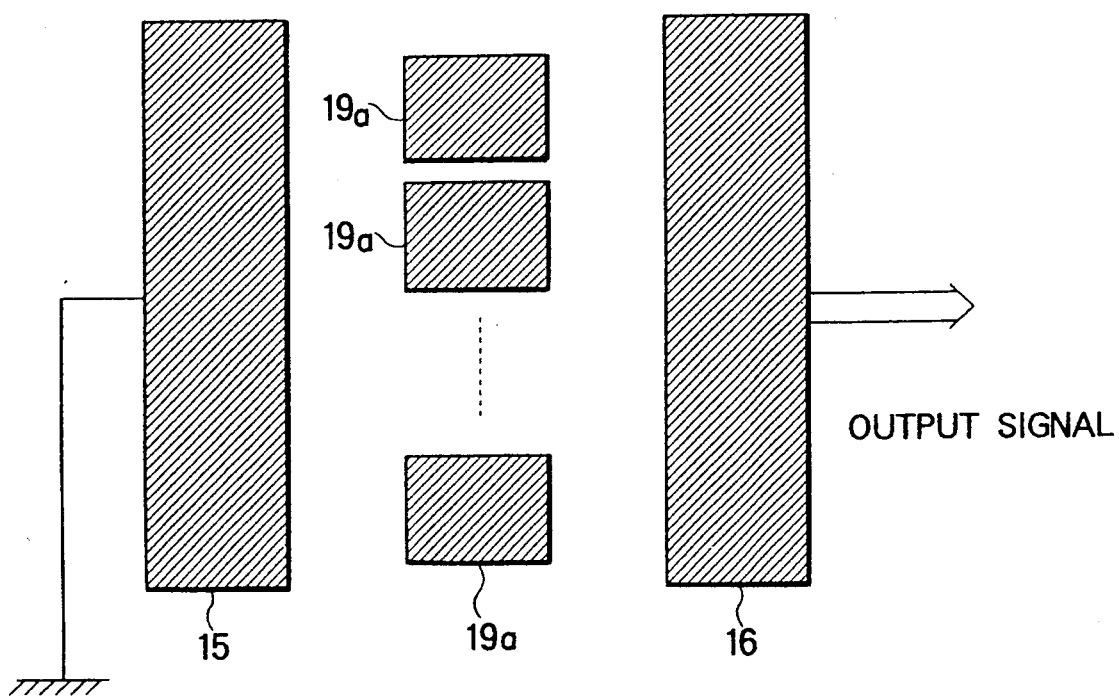
FIG. 8 is a schematic plan view of an example 6 of the organic electric-field switching device according to the present invention.
Figure 9:
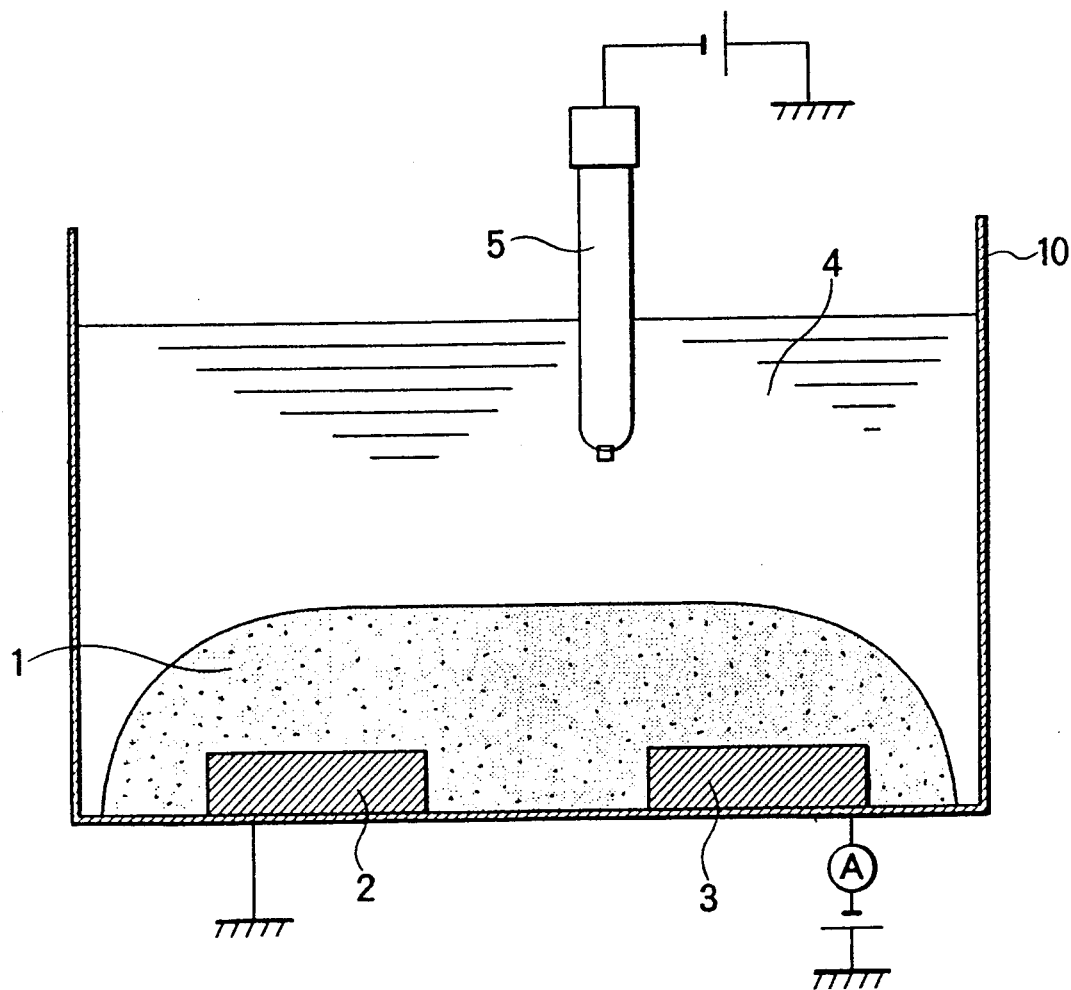
FIG. 9 is a sectional configuration view of a conventional organic electric-field switching device.

FIG. 8 is a schematic plan view of an example 6 of the organic electric-field switching device according to the present invention. In the example 6, a plurality of upper electrodes 19a are juxtaposed in a row substantiality padrallel to the source electrode 15 and the drain electrode 16. Namely, in FIG. 8, a plurality of upper electrodes 19a are disposed in parallel with the source electrode 15 and the drain electrode 16 therebetween.

When the plurality of input signals are biased on each upper electrode 19a as voltages, current which corresponds to the sum of the plurality of these input voltages flows between the source electrode 15 and the drain electrode 16. Consequently, a multi-inputs/single-output conversion function, which is one of the essential integral portion of the neural network for converting the plurality of the input signals (voltages) into one output signal (current), can be obtained.

When the distance between the source electrode 15 and the drain electrode 16, and also between the respective upper electrodes 19a, are reduced to an extent of the sub-micron area, the doping of carriers on the hereto-junction membrane 13 under each upper electrode 19a takes place when light, which can excite the DNI by penetrating each upper electrode 19a and the insulating film 14, is irradiated on the hereto-junction membrane 13, and when voltages are biased on each upper electrode 19a and the lower, and the lower electrode 11 at the same time. However, as time passes away, the area, where the carriers are doped, extends by diffusion from the portion of the hetero-junction membrane 13 under each upper electrode 19a, thus the characteristic of multi-inputs/single-output conversion function is changed into a non-linear characteristic.

Consequently, a function of plasticity which is an essential function of the neural network also can be obtained, wherein threshold values of current flowing between the source electrode 15 and the drain electrode 16 vary in accordance with the number of the input signals being biased on each upper electrode 19a.

What is claimed is:

1. An organic field switching device comprising:
    a lower electrode;
    a first insulation film formed locally on said lower electrode;
    an organic hetero-junction membrane formed on said first insulating film and said electrode;
    a second insulating and transparent or semitransparent film formed on said hetero-junction membrane;
    a source electrode formed on said hetero-junction membrane, penetrating said second insulating film;
    a drain electrode formed on said hetero-junction membrane, penetrating said second insulating film; and
    a transparent or semitransparent upper electrode formed on said second insulating film.

2. A device as defined in claim 1 wherein said hetero-junction membrane comprises a plurality of molecular films having different redox potentials.

3. A device as defined in claim 1 wherein said upper electrode is provided between said source electrode and said drain electrode.

4. A device as defined in claim 1 wherein a plurality of said upper electrodes are juxtaposed in a row substantially parallel to said source and drain electrodes therebetween.

5. A device as defined in claim 1 wherein said upper electrodes are juxtaposed in a row substantially series to said source and drain electrodes therebetween.

6. A device as defined in claim 1 wherein a plurality of said upper electrodes are juxtaposed in a matrix form between said source and drain electrodes.

7. An organic electric-field switching device comprising:
    a lower electrode;
    a first insulation film formed locally on said lower electrode;
    an organic hereto-junction membrane formed on said first insulating film and said lower electrode;
    a second insulating film formed on said hetero-junction membrane;
    a source electrode formed on said hetero-junction membrane, penetrating said second insulating film;
    a drain electrode formed on said hereto-junction membrane, penetrating said second insulating film; and
    an upper electrode formed on said second insulating film.

8. A device as defined in claim 7 wherein said hetero-junction membrane comprises a plurality of molecular films having different redox potentials.

9. A device as defined in claim 7 wherein said upper electrode is provided between said source electrode and said drain electrode.

10. A device as defined in claim 7 wherein a plurality of said upper electrodes are juxtaposed in a row substantially parallel to said source and drain electrodes therebetween.

11. A device as defined in claim 2 wherein said plurality of molecular films include a plurality of Langmuir-Blodgett laminated films.

12. A device as defined in claim 8 wherein said plurality of molecular films include a plurality of Langmuir-Blodgett laminated films.

* * * * *